(12) United States Patent
Yoon et al.

(10) Patent No.: US 10,396,139 B2
(45) Date of Patent: Aug. 27, 2019

(54) ORGANIC LIGHT-EMITTING DIODE (OLED) DISPLAY

(71) Applicant: Samsung Display Co., Ltd., Yongin-si, Gyeonggi-do (KR)

(72) Inventors: Ju-Won Yoon, Suwon-si (KR); Jung-Hwa Kim, Gunpo-si (KR); Min-Woo Woo, Bucheon-si (KR); Il-Jeong Lee, Seoul (KR); Jeong-Soo Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 382 days.

(21) Appl. No.: 14/833,345

(22) Filed: Aug. 24, 2015

(65) Prior Publication Data

US 2016/0233281 A1 Aug. 11, 2016

(30) Foreign Application Priority Data

Feb. 10, 2015 (KR) .................. 10-2015-0020217

(51) Int. Cl.
| | |
|---|---|
| *H01L 27/32* | (2006.01) |
| *H01L 33/00* | (2010.01) |
| *H01L 29/786* | (2006.01) |
| *H01L 27/12* | (2006.01) |

(52) U.S. Cl.
CPC ........ *H01L 27/3262* (2013.01); *H01L 27/124* (2013.01); *H01L 27/1222* (2013.01); *H01L 27/1225* (2013.01); *H01L 29/78645* (2013.01); *H01L 29/78696* (2013.01); *H01L 33/00* (2013.01)

(58) Field of Classification Search
CPC .... H01L 51/00; H01L 29/78645; H01L 33/00
See application file for complete search history.

(56) References Cited

U.S. PATENT DOCUMENTS

| | | | | |
|---|---|---|---|---|
| 2003/0102516 A1* | 6/2003 | Sambonsugi | ........... | H01L 27/11 257/393 |
| 2008/0246026 A1* | 10/2008 | Kim | .................... | H01L 27/3265 257/40 |

(Continued)

FOREIGN PATENT DOCUMENTS

| | | |
|---|---|---|
| KR | 10-2005-0104817 A | 11/2008 |
| KR | 10-2012-0008360 A | 1/2012 |

(Continued)

*Primary Examiner* — Lex H Malsawma
*Assistant Examiner* — Geoffrey H Ida
(74) *Attorney, Agent, or Firm* — Lewis Roca Rothgerber Christie LLP

(57) ABSTRACT

An organic light-emitting diode (OLED) display is disclosed. In one aspect, the OLED display includes a substrate and an active pattern formed over the substrate. The OLED display also includes first and second gate electrodes formed over the active pattern. The first gate electrode defines a first transistor together with the active pattern. The second gate electrode defines a second transistor and a third transistor together with the active pattern. The OLED display further includes a first conductive pattern formed over the first and second gate electrodes. The first conductive pattern overlaps at least a portion of the second and/or third transistors so as to define a parasitic capacitor.

21 Claims, 6 Drawing Sheets

(56) References Cited

U.S. PATENT DOCUMENTS

2009/0009441 A1* 1/2009 Yamamoto ........... G09G 3/3233
345/80
2009/0194766 A1* 8/2009 Park ................... H01L 29/7869
257/43

FOREIGN PATENT DOCUMENTS

KR 10-2012-0074422 A 7/2012
KR 10-2012-0075040 A 7/2012

* cited by examiner

SECOND
DIRECTION

FIRST
DIRECTION

ORGANIC LIGHT-EMITTING DIODE (OLED) DISPLAY

CROSS-REFERENCE TO RELATED APPLICATION(S)

This application claims priority under 35 USC § 119 to Korean Patent Applications No. 10-2015-0020217, filed on Feb. 10, 2015 in the Korean Intellectual Property Office (KIPO), the contents of which are incorporated herein in its entirety by reference.

BACKGROUND

Field

The described technology generally relates to an organic light-emitting diode (OLED) display.

Description of the Related Technology

Display devices display images by emitting light from a number of pixels. Each pixel of an OLED display includes an OLED. An OLED emits light having a wavelength which depends on an organic material included in the OLED. For example, OLEDs typically include organic materials in order to emit one of red, green, and blue colored light. OLED displays display images by mixing the different colors of light emitted from the OLEDs.

In a pixel circuit including an OLED, when a scan signal is turned-off, a kickback voltage is generated. When the kickback voltage occurs, a gate node of a driving transistor experiences an increased voltage fluctuation, leading to a stain (or striped pattern) being displayed.

SUMMARY OF CERTAIN INVENTIVE ASPECTS

One inventive aspect is an OLED display having an improved display quality.

Another aspect is an OLED display including a substrate, an active pattern, a gate insulation layer, a first gate electrode, a second gate electrode, a first insulating interlayer, a first conductive pattern, and an OLED. The active pattern is formed on the substrate, and includes a first region, a second region, a third region, a fourth region, a fifth region, and a sixth region. The second region and the sixth region are connected to each other. The fourth region and the fifth region are connected to each other. The gate insulation layer is formed on the active pattern. The first gate electrode is formed on the gate insulation layer, and defines a first transistor together with the first region and the second region. The second gate electrode is formed at the same level with the first gate electrode, and defines a second transistor together with the third region and the fourth region that are located along a first direction. The second gate electrode defines a third transistor together with the fifth region and the sixth region that are located along a second direction, and the second direction is perpendicular to the first direction. The first insulating interlayer is formed on the first gate electrode, the second gate electrode, and the gate insulation layer. The first conductive pattern is formed on the first insulating interlayer, and overlaps at least a portion the fourth and fifth regions. The first conductive pattern defines a parasitic capacitor together with the at least a portion the fourth and fifth regions with which the first conductive pattern is overlapped. The OLED receives a driving current from the first transistor. The second and third transistors provide an initialization voltage to the first transistor.

In example embodiments, the second gate electrode can include a second gate extended portion and a second gate protruding portion. The second gate extended portion can extend in the first direction, and the second gate protruding portion can be protruded from the second gate extended portion in the second direction.

In example embodiments, a first portion of the second gate extended portion can serve as a gate electrode of the third transistor, and the second gate protruding portion can serve as a gate electrode of the second transistor.

In example embodiments, the second and third transistor can be connected in series, and can serve as a dual gate transistor.

In example embodiments, the active pattern can further include a seventh region and an eighth region. The second gate electrode can define a fourth transistor together with the seventh region and the eighth region. A second portion that is opposite to the first portion of the second gate extended portion can serve as a gate electrode of the fourth transistor. The eighth region can be connected to the first region.

In example embodiments, the OLED display can further include a second conductive pattern. The second conductive pattern can be formed at the same level with the first conductive pattern, and can overlap the first gate electrode and the first and second regions of the active pattern. The second conductive pattern can include an opening that exposes at least a portion the first conductive pattern, and can defines a storage capacitor together with the first gate electrode.

In example embodiments, the second conductive pattern and the first conductive pattern can be simultaneously formed using the same materials.

In example embodiments, the OLED display can further include a second insulating interlayer formed on the first conductive pattern and the first insulating interlayer.

In example embodiments, the OLED display can further include a first connection pattern formed on the second insulating interlayer. The first connection pattern can provide the initialization voltage to the third region of the second transistor.

In example embodiments, the first connection pattern can fill a first contact hole, and can be electrically connected to the first conductive pattern via the first contact hole.

In example embodiments, the active pattern can further include a ninth region, a tenth region, an eleventh region, a twelfth region, a thirteenth region, a fourteenth region, a fifteenth region, a sixteenth region, a seventeenth region, and an eighteenth region.

In example embodiments, the OLED display can further include a third gate electrode and a fourth gate electrode. The third gate electrode can be formed on the gate insulation layer, and can define a fifth transistor together with the ninth region and the tenth region. The third gate electrode can define a sixth transistor together with the eleventh region and the twelfth region, and can define a seventh transistor together with the thirteenth region and the fourteenth region. The fourth gate electrode can be formed at the same level with the third gate electrode, and can define an eighth transistor together with the fifteenth region and a sixteenth region. The fourth gate electrode can define a ninth transistor together with the seventeenth region and the eighteenth region.

In example embodiments, the ninth region can be connected to the eleventh region, and the tenth region can be connected to the third region. The twelfth region can be connected to the fourteenth region, and the fifteenth region can be connected to the second region and sixth region. The seventeenth region can be connected to the first region and eighth region.

In example embodiments, the OLED display can further include a third insulating interlayer formed on the first connection pattern and the second insulating interlayer. The OLED includes a first electrode, an organic light-emitting layer, and a second electrode. The first electrode can be formed on the third insulating interlayer, and can be electrically connected to the thirteenth region or the sixteenth region. The organic light-emitting layer can be formed on the first electrode. The second electrode can be formed on the organic light-emitting layer.

In example embodiments, the second gate electrode can receive a scan signal. The third gate electrode can receive a data initialization signal, and the fourth gate electrode can receive a light-emitting signal.

In example embodiments, the first conductive pattern can be electrically connected to the fourteenth region via the first contact hole of the first connection pattern. After the initialization voltage is applied to the fourteenth region, the initialization voltage can be provided to the twelfth region of the sixth transistor.

In example embodiments, the OLED display can further include a second connection pattern formed on the second insulating interlayer. The second connection pattern can contact a portion of the third or tenth regions and a portion of the first gate electrode.

The second connection pattern can fill a second contact hole that is located in the portion of the third or tenth regions and a third contact hole that is located in the portion of the first gate electrode.

In example embodiments, the OLED display can further include a data line at the same level with the second connection pattern. The data line can extend in the second direction, and the data line can fill a fourth contact hole that is located in the seventh region.

In example embodiments, the fifth and sixth transistors can be connected in series, and can serve as a dual gate transistor.

In example embodiments, the active pattern can include an oxide semiconductor.

Another aspect is an OLED display comprising a substrate; an active pattern formed over the substrate and including: a first region, a second region, a third region, a fourth region, a fifth region, and a sixth region, wherein the second region and the sixth region are electrically connected to each other, and wherein the fourth region and the fifth region are electrically connected to each other; a gate insulation layer formed over the active pattern; a first gate electrode formed over the gate insulation layer, wherein the first gate electrode defines a first transistor together with the first region and the second region; a second gate electrode formed on the same layer as the first gate electrode, wherein the second gate electrode defines: i) a second transistor together with the third region and the fourth region which are arranged in a first direction ii) a third transistor together with the fifth region and the sixth region which are arranged in a second direction, wherein the second direction is substantially perpendicular to the first direction; a first insulating interlayer formed over the first gate electrode, the second gate electrode, and the gate insulation layer; a first conductive pattern formed over the first insulating interlayer, wherein the first conductive pattern overlaps at least a portion the fourth and fifth regions, wherein the first conductive pattern defines a parasitic capacitor together with the portion the fourth and fifth regions; and an OLED configured to receive a driving current from the first transistor, wherein the second and third transistors are configured to provide an initialization voltage to the first transistor.

In example embodiments, the second gate electrode includes a second gate extended portion extending in the first direction; and a second gate protruding portion protruded from the second gate extended portion in the second direction.

In example embodiments, a first portion of the second gate extended portion is configured to serve as a gate electrode of the third transistor, and wherein a first portion of the second gate protruding portion is configured to serve as a gate electrode of the second transistor.

In example embodiments, the second and third transistor are electrically connected in series and configured to serve as a dual gate transistor.

In example embodiments, the active pattern further includes a seventh region and an eighth region, wherein the second gate electrode defines a fourth transistor together with the seventh region and the eighth region, wherein a second portion that opposes the first portion of the second gate extended portion is configured to serve as a gate electrode of the fourth transistor, and wherein the eighth region is electrically connected to the first region.

In example embodiments, the OLED display further comprises a second conductive pattern formed on the same layer the first conductive pattern, wherein the second conductive pattern overlaps the first gate electrode and the first and second regions of the active pattern, wherein the second conductive pattern defines an opening that exposes at least a portion the first conductive pattern, and wherein the second conductive pattern defines a storage capacitor together with the first gate electrode.

In example embodiments, the second conductive pattern and the first conductive pattern are simultaneously formed using the same materials.

In example embodiments, the OLED display further comprises a second insulating interlayer formed over the first conductive pattern and the first insulating interlayer.

In example embodiments, the OLED display further comprises a first connection pattern formed over the second insulating interlayer, wherein the first connection pattern is configured to apply the initialization voltage to the first conductive pattern.

In example embodiments, the first connection pattern fills a first contact hole, and wherein the first connection pattern is electrically connected to the first conductive pattern via the first contact hole.

In example embodiments, the active pattern further includes a ninth region, a tenth region, an eleventh region, a twelfth region, a thirteenth region, a fourteenth region, a fifteenth region, a sixteenth region, a seventeenth region, and an eighteenth region.

In example embodiments, the OLED display further comprises a third gate electrode formed over the gate insulation layer, wherein the third gate electrode defines: i) a fifth transistor together with the ninth region and the tenth region, ii) a sixth transistor together with the eleventh region and the twelfth region, and iii) a seventh transistor together with the thirteenth region and the fourteenth region; and a fourth gate electrode formed on the same layer as the third gate electrode, wherein the fourth gate electrode defines: i) an eighth transistor together with the fifteenth region and a sixteenth region and ii) a ninth transistor together with the seventeenth region and the eighteenth region.

In example embodiments, the ninth region is electrically connected to the eleventh region, wherein the tenth region is electrically connected to the third region, wherein the twelfth region is electrically connected to the fourteenth region, wherein the fifteenth region is electrically connected to the second region and the sixth region, and wherein the seventeenth region is electrically connected to the first region and the eighth region.

In example embodiments, the OLED display further comprises a third insulating interlayer formed over the first connection pattern and the second insulating interlayer, wherein the OLED includes a first electrode formed over the third insulating interlayer, wherein the first electrode is electrically connected to the thirteenth region or the sixteenth region; an organic light-emitting layer formed over the first electrode; and a second electrode formed over the organic light-emitting layer.

In example embodiments, the second gate electrode is configured to receive a scan signal, wherein the third gate electrode is configured to receive a data initialization signal, and wherein the fourth gate electrode is configured to receive an emission signal.

In example embodiments, the first conductive pattern is electrically connected to the fourteenth region via the first contact hole, and wherein the twelfth region of the sixth transistor is configured to receive the initialization voltage via the fourteenth region.

In example embodiments, the OLED display further comprises a second connection pattern formed over the second insulating interlayer, wherein the second connection pattern is electrically connected to a portion of the third or tenth regions and a portion of the first gate electrode, wherein the second connection pattern fills a second contact hole that is located over the portion of the third or tenth regions and a third contact hole that is located over the portion of the first gate electrode.

In example embodiments, the OLED display further comprises a data line formed over the same layer as the second connection pattern, wherein the data line extends in the second direction, and wherein the data line fills a fourth contact hole that is located over the seventh region.

In example embodiments, the fifth and sixth transistors are electrically connected in series and configured to serve as a dual gate transistor.

In example embodiments, the active pattern is formed of an oxide semiconductor.

As an OLED display according to at least one example embodiment includes a parasite capacitor including a conductive pattern applied to an initialization voltage, a voltage fluctuation can be decreased in a gate node of a driving transistor. Accordingly, the display quality of the OLED display can be improved.

BRIEF DESCRIPTION OF THE DRAWINGS

Example embodiments can be understood in more detail from the following description taken in conjunction with the accompanying drawings.

DETAILED DESCRIPTION OF CERTAIN INVENTIVE EMBODIMENTS

In a pixel circuit including an OLED, when a scan signal is turned-off, a kickback voltage is generated. When the kickback voltage occurs, a gate node of a driving transistor experiences an increased voltage fluctuation, leading to a stain (or striped pattern) being displayed.

Hereinafter, embodiments of the described technology will be explained in detail with reference to the accompanying drawings.

Figure 1:
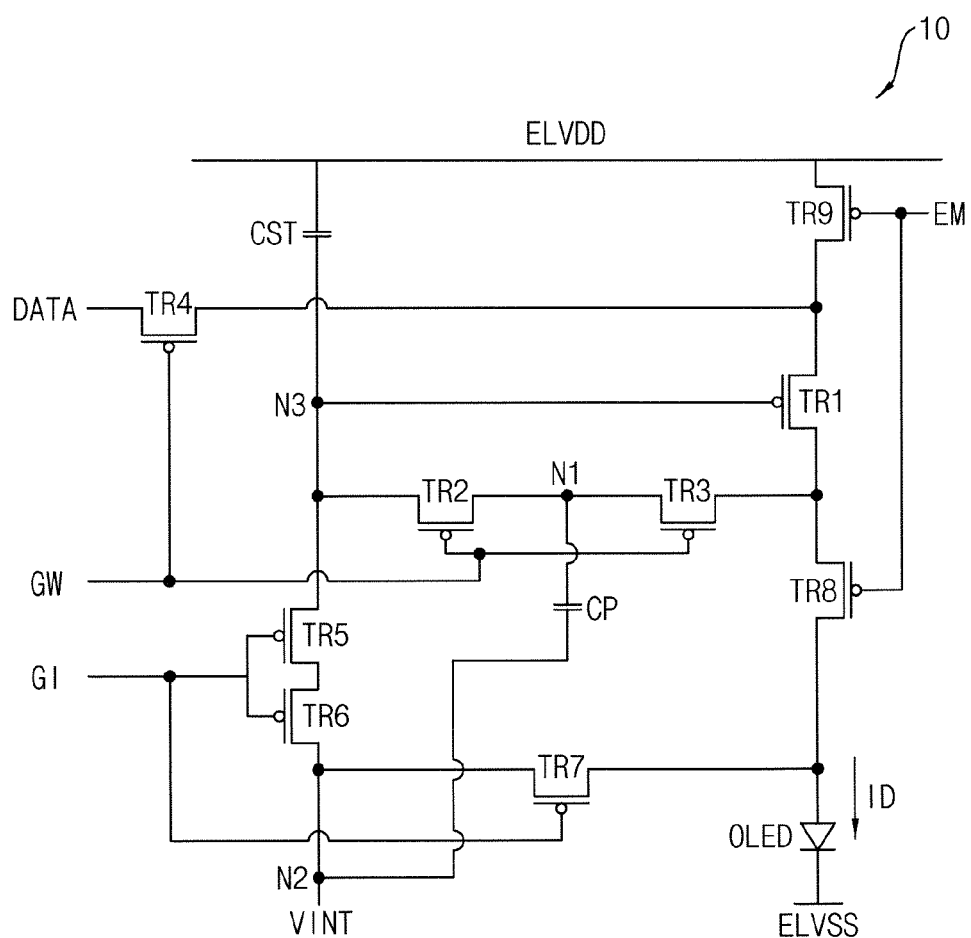
FIG. 1 is a circuit diagram illustrating a pixel in accordance with example embodiments.

FIG. 1 is a circuit diagram illustrating a pixel in accordance with example embodiments.

Referring to FIG. 1, the pixel 10 includes an OLED, a first transistor TR1, a second transistor TR2, a third transistor TR3, a fourth transistor TR4, a fifth transistor TR5, a sixth transistor TR6, a seventh transistor TR7, an eighth transistor TR8, a ninth transistor TR9, a storage capacitor CST, and a parasite capacitor CP.

The OLED can emit light based on a driving current ID. The OLED includes a first terminal and a second terminal. In example embodiments, the second terminal of the OLED receives a second power voltage ELVSS. For example, the first terminal can be an anode of the OLED, and the second terminal of the OLED can be a cathode. Alternatively, the first terminal of the OLED can be a cathode, and the second terminal of the OLED can be an anode.

The first transistor TR1 includes a gate terminal, a first terminal, and a second terminal. In example embodiments, the first terminal is a source terminal, and the second terminal is a drain terminal. Alternatively, the first terminal can be a drain terminal, and the second terminal can be a source terminal.

The driving current ID can be generated by the first transistor TR1. In example embodiments, the first transistor TR1 operates in a saturation region. In these embodiments, the first transistor TR1 generates the driving current ID based on a voltage difference between the gate terminal and the source terminal thereof. The gradation of light emitted from the OLED can be implemented based on the magnitude of the driving current ID generated by the first transistor TR1. In some example embodiments, the first transistor TR1 operates in a linear region. In these embodiments, the gradation of the light emitted from the OLED can be implemented based on the time period during which the first transistor TR1 provides the driving current ID to the OLED within one frame.

The second transistor TR2 can include a gate terminal, a first terminal, and a second terminal. Similarly, the third transistor TR3 can include a gate terminal, a first terminal, and a second terminal. Here, the second transistor TR2 and the third transistor TR3 can be connected in series and can serve as a dual gate transistor. For example, when the dual transistor is turned-off, a leakage current may be decreased. Thus, the second terminal of the second transistor TR2 can be connected to the first terminal of the third transistor TR3. Each of the gate terminals of the second and third transistors TR2 and TR3 can receive a scan signal GW. The first terminal of the second transistor TR2 can be connected to the gate terminal of the first transistor TR1. The second terminal of the third transistor TR3 can be connected to the second terminal of the first transistor TR1. In example embodiments, each of the first terminals of the second and third transistors TR2 and TR3 is a source terminal and each of the second terminals of the second and third transistors TR2 and TR3 is a drain terminal. Alternatively, each of the first terminals of the second and third transistors TR2 and TR3 can be a drain terminal and each of the second terminals of the second and third transistors TR2 and TR3 can be a source terminal.

The second and third transistors TR2 and TR3 can connect the gate terminal of the first transistor TR1 to the second terminal of the first transistor TR1 while the scan signal GW is activated. The second and third transistors TR2 and TR3 can operate in a linear region. That is, the second and third transistors TR2 TR3 can form a diode connection between the gate and second terminals of the first transistor TR1 while the scan signal GW is activated. The diode connection can apply a voltage difference between the first terminal of the first transistor TR1 and the gate terminal of the first transistor TR1 which corresponds to a threshold voltage of the first transistor TR1. As a result, the sum of the voltage of the data signal DATA provided to the first terminal of the first transistor TR1 and the voltage difference (i.e., the threshold voltage) can be applied to the gate terminal of the first transistor TR1 while the scan signal GW is activated. Thus, the data signal DATA can be compensated by the threshold voltage of the first transistor TR1. The compensated data signal DATA can be applied to the gate terminal of the first transistor TR1. The uniformity of the driving current ID can be improved by reducing the effect of the threshold voltage of the first transistor TR1 via the data compensation.

A first node N1 is located between the second transistor TR2 and the third transistor TR3. In addition, a second node N2 is located at an input terminal of an initialization voltage VINT. For example, the input terminal of an initialization voltage VINT can be connected to a first terminal of the sixth transistor TR6 and a first terminal of the seventh transistor TR7. In example embodiments, the pixel 10 includes the parasite capacitor CP where the first node N1 overlaps the second node N2. In these embodiments, when the scan signal GW is turned-off, the parasite capacitor CP can decrease a kickback voltage. Accordingly, since the pixel 10 includes the parasite capacitor CP, a voltage fluctuation capable of being generated in a third node N3 may be reduced.

The fourth transistor TR4 includes a gate terminal, a first terminal, and a second terminal. The scan signal GW can be applied to the gate terminal. The first terminal can receive the data signal DATA. The second terminal can be connected to the first terminal of the first transistor TR1. In example embodiments, the first terminal of the fourth transistor TR4 is a source terminal, and the second terminal of the fourth transistor TR4 is a drain terminal. In some example embodiments, the first terminal of the fourth transistor TR4 is a drain terminal, and the second terminal of the fourth transistor TR4 is a source terminal.

The fourth transistor TR4 can provide the data signal DATA to the first terminal of the first transistor TR1 while the scan signal GW is activated. The fourth transistor TR4 can operate in a linear region.

The fifth transistor TR5 includes a gate terminal, a first terminal, and a second terminal, and the sixth transistor TR6 includes a gate terminal, a first terminal, and a second terminal. Here, the fifth transistor TR5 and the sixth transistor TR6 can be connected in series and can serve as a dual gate transistor. For example, when the dual transistor is turned-off, a leakage current can be decreased. Thus, the second terminal of the fifth transistor TR5 can be connected to the first terminal of the sixth transistor TR6. Each of the gate terminals of the fifth and sixth transistors TR5 and TR6 can receive a data initialization signal GI. The initialization voltage VINT can be applied to the first terminal of the fifth transistor TR5. The second terminal of the sixth transistor TR6 can be connected to the gate terminal of the first transistor TR1. In example embodiments, each of the first terminals of the fifth and sixth transistors TR5 and TR6 can be a source terminal and each of the second terminals of the fifth and sixth transistors TR5 and TR6 can be a drain terminal. Alternatively, each of the first terminals of the fifth and sixth transistors TR5 and TR6 can be a drain terminal, and each of the second terminals of the fifth and sixth transistors TR5 and TR6 can be a source terminal.

The fifth and sixth transistors TR5 and TR6 can apply the initialization voltage VINT to the gate terminal of the first transistor TR1 while the data initialization signal GI is activated. In some embodiments, the fifth and sixth transistors TR5 and TR6 operate in the linear region. Thus, the fifth and sixth transistors TR5 and TR6 can initialize the gate terminal of the first transistor TR1 to the initialization voltage VINT while the data initialization signal GI is activated. In example embodiments, the voltage level of the initialization voltage VINT is sufficiently less than a voltage level of the data signal DATA maintained by the storage capacitor CST in a previous frame. The initialization voltage VINT can be applied to the gate terminal of the first transistor TR1 that is a P-channel metal oxide semiconductor (PMOS) type transistor. In some example embodiments, the voltage level of the initialization voltage VINT is sufficiently greater than the voltage level of the data signal DATA maintained by the storage capacitor CST in a previous frame. The initialization voltage VINT can be applied to the gate terminal of the first transistor TR1 that is an N-channel metal oxide semiconductor (NMOS) type transistor.

In example embodiments, the data initialization signal GI is substantially identical to the scan signal GW advanced by one horizontal time. For example, the data initialization signal GI is applied to pixels located in the (n)th row of a plurality of pixels included in a display panel (where n is an integer of 2 or more), and the data initialization signal GI can be substantially the same as the scan signal GW applied to pixels located in the (n−1)th row of the pixels. Thus, the data initialization signal GI that is activated can be applied to pixels located in the (n)th row by applying the scan signal GW that is activated to pixels located in the (n−1)th row. As a result, the gate terminal of the first transistor TR1 included in pixels located in the (n)th row can be initialized to the initialization voltage VINT when the data signal DATA is applied pixels located in the (n−1)th row.

The seventh transistor TR7 includes a gate terminal, a first terminal, and a second terminal. A diode initialization signal (e.g., the data initialization signal GI) can be applied to the gate terminal of the seventh transistor TR7. The initialization voltage VINT can be applied to the first terminal of the seventh transistor TR7. In example embodiments, the first terminal of the seventh transistor TR7 is a source terminal and the second terminal of the seventh transistor TR7 is a drain terminal. In some example embodiments, the first terminal of the seventh transistor TR7 is a drain terminal and the second terminal of the seventh transistor TR7 is a source terminal.

The seventh transistor TR7 can apply the initialization voltage VINT to the first terminal of the OLED while the diode initialization signal is activated. In these embodiments, the seventh transistor TR7 can operate in the linear region. Thus, the seventh transistor TR7 can initialize the first terminal of the OLED to the initialization voltage VINT while the diode initialization signal is activated.

In example embodiments, the data initialization signal GI and the diode initialization signal are the same signal. In some embodiments, the initialization operation of the gate terminal of the first transistor TR1 does not affect the initialization operation of the first terminal of the OLED. Therefore, the data initialization signal GI can be used as the diode initialization signal GB, thereby improving the manufacturing efficiency.

The eighth transistor TR8 includes a gate terminal, a first terminal, and a second terminal. The emission signal EM can be applied to the gate terminal. The first terminal of the eighth transistor TR8 can be connected to the second terminal of the first transistor TR1. The second terminal can be connected to the first terminal of the OLED. In example embodiments, the first terminal of the eighth transistor TR8 is a source terminal and the second terminal of the eighth transistor TR8 is a drain terminal. In some example embodiments, the first terminal of the eighth transistor TR8 is a drain terminal and the second terminal of the eighth transistor TR8 is a source terminal.

The eighth transistor TR8 can provide the driving current ID generated by the first transistor TR1 to the OLED while the emission signal EM is activated. In these embodiments, the eighth transistor TR8 can operate in the linear region. Thus, the eighth transistor TR8 can provide the driving current ID generated by the first transistor TR1 to the OLED while the emission signal EM is activated such that the OLED emits light. In addition, the eighth transistor TR8 can disconnect the first transistor TR1 from the OLED while the emission signal EM is inactivated such that the compensated data signal DATA applied to the second terminal of the first transistor TR1 is applied to the gate terminal of the first transistor TR1.

The ninth transistor TR9 can apply the first power voltage ELVDD to the first terminal of the first transistor TR1 while the emission signal EM is activated. The ninth transistor TR9 does not apply the first power voltage ELVDD while the emission signal EM is inactivated. In these embodiments, the ninth transistor TR9 can operate in the linear region. The ninth transistor TR9 can apply the first power voltage ELVDD to the first terminal of the first transistor TR1 while the emission signal EM is activated such that the first transistor TR1 generates the driving current ID. In addition, the ninth transistor TR9 does not apply the first power voltage ELVDD while the emission signal EM is inactivated such that the data signal DATA applied to the first terminal of the first transistor TR1 is applied to the gate terminal of the first transistor TR1.

The storage capacitor CST can be connected between a first power voltage ELVDD line and the gate terminal of the first transistor TR1. The storage capacitor CST can maintain a voltage level of the gate terminal of the first transistor TR1 while the scan signal GW is inactivated. An emission signal EM can be activated while the scan signal GW is inactivated. The driving current ID generated by the first transistor TR1 can be provided to the OLED while the emission signal EM is activated. Therefore, the driving current ID generated by the first transistor TR1 can be provided to the OLED based on the voltage level maintained by the storage capacitor CST.

Figure 2:
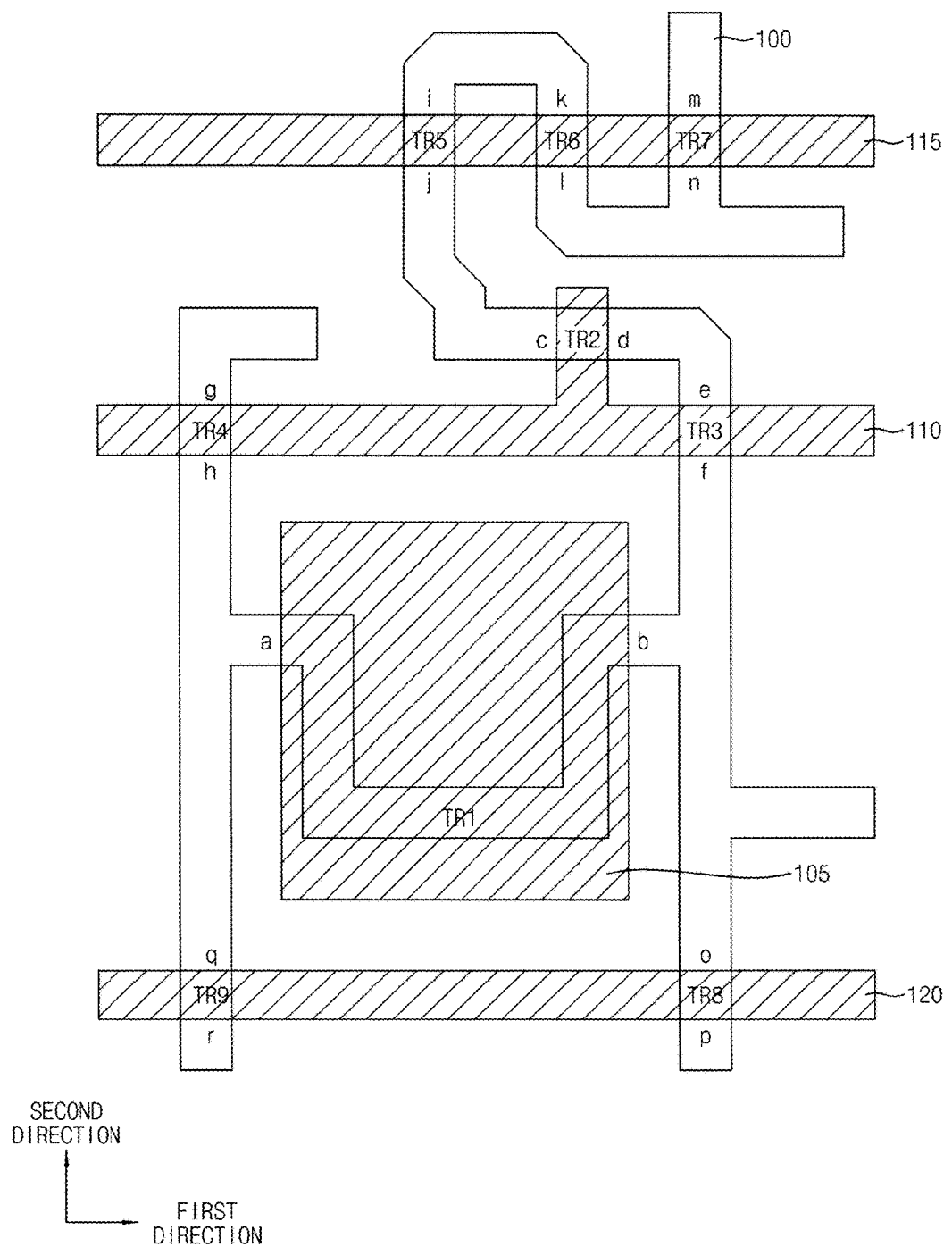
FIGS. 2 through 4 are layout diagrams illustrating an OLED display including the pixel in accordance with example embodiments.
Figure 3:
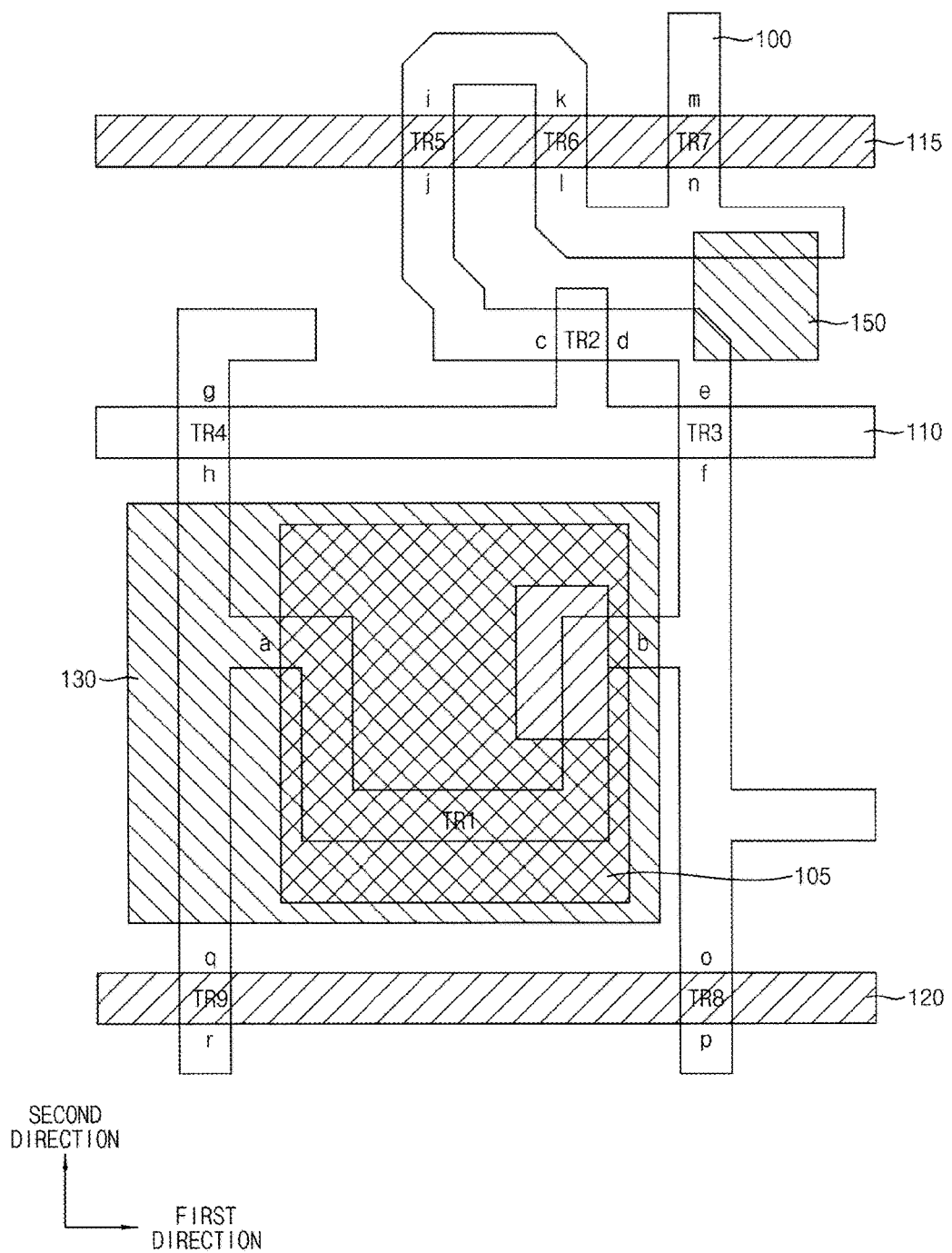
Figure 4:
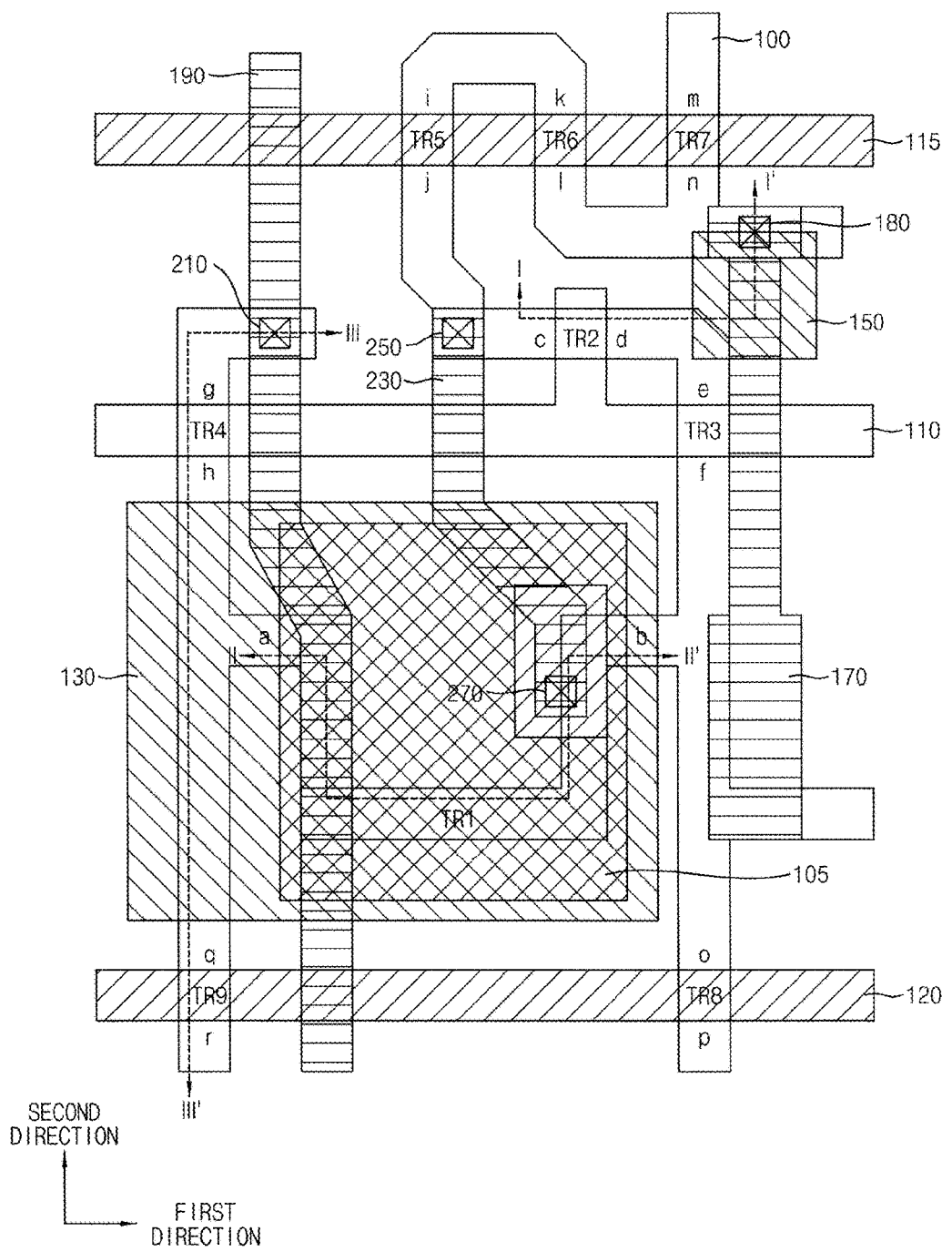

FIGS. 2 through 4 are layout diagrams illustrating an OLED display including the pixel in accordance with example embodiments.

Referring to FIG. 2, the OLED display includes a substrate (not illustrated), an active pattern 100, a gate insulation layer (not illustrated), a first gate electrode 105, a second gate electrode 110, a third gate electrode 115, a forth gate electrode 120, etc.

The substrate can be formed of an electrically insulating material, such as a glass, a transparent plastic, a transparent metal oxide, etc. Although it is not illustrated, one or more buffer layer(s) can be provided on the substrate. For example, the buffer layer can be formed of one of the following materials: a silicon oxide, a silicon nitride, a silicon oxynitride, etc.

The active pattern 100 can be formed on the substrate. The active pattern 100 can include silicon. Alternatively, the active pattern 100 can be formed of a semiconductor oxide including a binary compound (ABx), a ternary compound (ABxCy), a quaternary compound (ABxCyDz), etc. which contains one or more of the following materials: indium, zinc, gallium, tin, titanium, aluminum, hafnium (Hf), zirconium (Zr), magnesium (Mg), etc. These compounds can be used alone or in combinations thereof.

The active pattern 100 may include first through eighteenth regions A, B, C, D, E, F, G, H, I, J, K, L, M, N, O, P, Q, and R. The regions A, B, C, D, E, F, G, H, I, J, K, L, M, N, O, P, Q, and R can be doped with an impurity, and thus can have an electrical conductivity that is greater than that of other regions of the active pattern 100. The regions A, B, C, D, E, F, G, H, I, J, K, L, M, N, O, P, Q, and R can be source terminals or drain terminals of first through ninth transistors TR1, TR2, TR3, TR4, TR5, TR6, TR7, TR8, and TR9. Boundaries between the regions A, B, C, D, E, F, G, H, I, J, K, L, M, N, O, P, Q, and R may not be clearly defined, and the regions A, B, C, D, E, F, G, H, I, J, K, L, M, N, O, P, Q, and R can be electrically connected to each other. For example, as illustrated in FIG. 2, the second region B may not have a clear boundary with the sixth region F and/or the fifteenth region O, and the second, sixth and fifteenth regions B, F, and 0 can be connected to each other.

The gate insulation layer can be formed over the substrate to cover the active pattern 100. The gate insulation layer can include a silicon compound, metal oxide, etc. For example, the gate insulation layer can include one or more of the following materials: silicon oxide, silicon nitride, silicon oxynitride, aluminum oxide, tantalum oxide, hafnium oxide, zirconium oxide, titanium oxide, etc., which can be used alone or in combinations thereof. In example embodiments, the gate insulation layer can have a multilayer structure including a silicon oxide layer and a silicon nitride layer.

The first to fourth gate electrodes 105 to 120 can be formed over the gate insulation layer. The first to fourth gate electrodes 105 to 120 can be formed at the same level. The first to fourth gate electrodes 105 to 120 can include one or more of the following materials: metal, alloy, metal nitride, conductive metal oxide, transparent conductive material, etc. For example, the first to fourth gate electrodes 105 to 120 can be formed of one or more of the following materials: aluminum (Al), silver (Ag), tungsten (W), copper (Cu), nickel (Ni), chromium (Cr), molybdenum (Mo), titanium (Ti), platinum (Pt), tantalum (Ta), neodymium (Nd), scandium (Sc), and an alloy or a conductive nitride thereof. Alternatively, the first to fourth gate electrodes 105 to 120 can be formed of one or more of the following materials: strontium ruthenium oxide (SrRuxOy), zinc oxide (ZnOx), indium tin oxide (ITO), tin oxide (SnOx), indium oxide (InOx), gallium oxide (GaOx), indium zinc oxide (IZO), etc.

The first gate electrode 105 can form or define the first transistor TR1 together with the first region A and the second region B. In example embodiments, the first region A is a source region and the second region B is a drain region.

Alternatively, the first region A can be a drain region, and the second region B can be a source region. The first and second regions A and B can be doped with an impurity. However, in certain embodiments, the region of the active pattern 100 formed below the first gate electrode 105 is not doped with an impurity. Thus, the first and second regions A and B can operate as conductors, and the region of the active pattern 100 formed below the first gate electrode 105 can operate as a channel of the first transistor TR1. Accordingly, the first transistor TR1 can generate a driving current ID as illustrated in FIG. 1 as provided to an OLED, and the OLED can emit light based on the driving current ID.

The second gate electrode 110 can include a second gate extended portion and a second gate protruding portion. Here, the second gate extended portion can extend in a first direction, and the second gate protruding portion can be protruded from the second gate extended portion in a second direction that is substantially perpendicular to the first direction. The second gate protruding portion can form or define the second transistor TR2 together with the third region C and the fourth region D. For example, the second gate protruding portion can serve as a gate electrode of the second transistor TR2. The second gate extended portion can include a first portion and a second portion that is opposite to the first portion. The first portion of the second gate extended portion can form or define the third transistor TR3 together with the fifth region E and the sixth region F, and the second portion of the second gate extended portion can form or define the fourth transistor TR4 together with the seventh region G and the eighth region H. That is, the third and fourth regions C and D can be located in the first direction, and the fifth and sixth regions E and F and the seventh and eighth regions G and H can be located in the second direction. Here, the second transistor TR2 and the third transistor TR3 can be connected in series and can serve as a dual gate transistor. For example, when the dual transistor is turned-off, a leakage current can be decreased. Thus, the fourth region D of the second transistor TR2 can be electrically connected to the fifth region E of the third transistor TR3. In addition, the eighth region H can be electrically connected to the first region A, and the sixth region F can be electrically connected to the second region B. In example embodiments, the fourth and fifth regions D and E define a first node N1.

The third region C, the fourth region D, the fifth region E, the sixth region F, the seventh region G, and the eighth region H can be doped with an impurity. However, regions of the active pattern 100 formed below the second gate electrode 110 are not doped with an impurity. Thus, the third to eighth regions C to H can operate as conductors, and the regions of the active pattern 100 formed below the second gate electrode 110 can operate as channels of the second to fourth transistors TR2 to TR4. In example embodiments, the second gate electrode 110 can receive a scan signal GW as illustrated in FIG. 1.

In example embodiments, each of the third region C, the fifth region E, the seventh region G is a source region and each of the fourth region D, the sixth region F, and the eighth region H is a drain region. Alternatively, each of the third region C, the fifth region E, and the seventh region G can be a drain region, and each of the fourth region D, the sixth region F, and the eighth region H can be a source region.

The third gate electrode 115 can extend in the first direction. The third gate electrode 115 can form or define the fifth transistor TR5 together with the ninth region I and the tenth region J and can form or define the sixth transistor TR6 together with the eleventh region K and the twelfth region L.

In addition, the third gate electrode 115 can form or define the seventh transistor TR7 together with the thirteenth region M and the fourteenth region N. That is, the ninth and tenth regions I and J, the eleventh and twelfth regions K and L, and the thirteenth and fourteenth regions M and N can be located in the second direction. Here, the fifth transistor TR5 and the sixth transistor TR6 can be connected in series and can serve as a dual gate transistor.

For example, when the dual transistor is turned-off, a leakage current can be decreased. Thus, the ninth region I of the fifth transistor TR5 can be electrically connected to the eleventh region K of the sixth transistor TR6. In addition, the tenth region J can be electrically connected to the third region C, and the twelfth region L can be electrically connected to the fourteenth region N. Further, the thirteenth region M can be electrically connected to the sixteenth region P. In example embodiments, the fourth region D and the fifth region E can be a first node N1.

The ninth region I, the tenth region J, the eleventh region K, the twelfth region L, the thirteenth region M, and the fourteenth region N can be doped with an impurity. However, in certain embodiments, a region of the active pattern 100 formed below the third gate electrode 115 is not doped with an impurity. Thus, the ninth region I, the tenth region J, the eleventh region K, the twelfth region L, the thirteenth region M, and the fourteenth region N can operate as conductors, and the region of the active pattern 100 formed below the third gate electrode 115 can operate as a channel of the fifth transistor TR5. In example embodiments, the third gate electrode 115 can receive a data initialization signal GI as illustrated in FIG. 1, and the twelfth region L and the fourteenth region N can receive an initialization voltage VINT as illustrated in FIG. 1.

In example embodiments, each of the ninth region I, the twelfth region L, and the fourteenth region N is a source region and each of the tenth region J, the eleventh region K, and the thirteenth region M is a drain region. Alternatively, the each of the ninth region I, the twelfth region L, and the fourteenth region N can be a drain region, and tenth region J, the eleventh region K, and the thirteenth region M can be a source region.

The fourth gate electrode 120 can form or define the eighth transistor TR8 together with the fifteenth region O and the sixteenth region P and can form or define the ninth transistor TR9 together with the seventeenth region Q and the eighteenth region R. That is, the fifteenth and sixteenth regions O and P and the seventeenth and eighteenth regions Q and R can be located in the second direction.

The seventeenth region Q can be electrically connected to the first region A and the eighth region H, and the fifteenth region O can be electrically connected to the second region B and the sixth region F. The fifteenth region O, the sixteenth region P, the seventeenth region Q, and the eighteenth region R can be doped with an impurity. However, in certain embodiments, the regions of the active pattern 100 formed below the fourth gate electrode 120 are not doped with an impurity. Thus, the fifteenth region O, the sixteenth region P, the seventeenth region Q, and the eighteenth region R can operate as conductors, and the regions of the active pattern 100 formed below the fourth gate electrode 120 can respectively operate as a channel of the eighth transistor TR8 and the ninth transistor TR9. In example embodiments, the fourth gate electrode 120 can receive an emission signal EM illustrated in FIG. 1.

In example embodiments, each of the sixteenth region P and the eighteenth region R is source region and the each of the fifteenth region O and the seventeenth region Q is drain region. Alternatively, each of the sixteenth region P and the eighteenth region R can be drain region, and each of the fifteenth region O and the seventeenth region Q can be source region.

Referring to FIG. 3, an OLED display can include a substrate (not illustrated), an active pattern 100, a gate insulation layer (not illustrated), a first gate electrode 105, a second gate electrode 110, a third gate electrode 115, and a forth electrode 120 as shown in FIG. 2. The OLED display can further include a first insulating interlayer (not illustrated), a first conductive pattern 150, and a second conductive pattern 130.

The first insulating interlayer is formed over the gate insulation layer to cover the first to fourth gate electrodes 105 to 120. In example embodiments, the first insulating interlayer sufficiently covers the first to fourth gate electrodes 105 to 120 and has a substantially level surface without steps around the first to fourth gate electrodes 105 to 120. In some example embodiments, the first insulating interlayer covers the first to fourth gate electrodes 105 to 120 and has a substantially uniform thickness along a profile of the first to fourth gate electrodes 105 to 120. The first insulating interlayer can be formed of one or more of the following: an organic material, such as a silicon compound, or an inorganic material, such as a transparent insulating resin. For example, the first insulating interlayer can be formed of one or more of the following: a silicon oxide, a silicon nitride, a silicon oxynitride, and etc. These can be used alone or in combination with each other.

The first conductive pattern 150 and the second conductive pattern 130 can be formed over the first insulating interlayer. Each of the first and second conductive patterns 150 and 130 can be formed of at least one of the following: a metal, an alloy, metal nitride, conductive metal oxide, transparent conductive materials, etc. These can be used alone or in a suitable combination thereof. That is, the first and second conductive patterns 150 and 130 can be simultaneously formed using the same materials.

The first conductive pattern 150 can overlap at least a portion the fourth and fifth regions D and E (e.g., a first node N1). Accordingly, the first conductive pattern 150 can form or define a parasitic capacitor as illustrated in FIG. 1 together with the at least a portion the fourth and fifth regions D and E with which the first conductive pattern 150 overlaps. In addition, the first conductive pattern 150 can overlap at least a portion the fourteenth region N. That is, the first conductive pattern 150 can overlap at least a portion the fourth region D, the fifth region E, and the fourteenth region N. The first conductive pattern 150 and the fourteenth region N can receive the initialization voltage VINT illustrated in FIG. 1 via a first connection pattern that will be described below.

The second conductive pattern 130 can overlap the first gate electrode 105. Thus, the second conductive pattern 130 can form or define a storage capacitor CST as illustrated in FIG. 1 together with the first gate electrode 105. The second conductive pattern 130 can extend in a direction substantially parallel to an upper surface of the substrate in the region that overlaps the first gate electrode 105. As a result, the second conductive pattern 130 can overlap the first region A, the eighth region H, and the seventeenth region Q of the active pattern 100. That is, the conductive pattern 132 can overlap the source node of the active pattern 100. In example embodiments, the second conductive pattern 130 can receive the first power voltage ELVDD illustrated in FIG. 1. In addition, the second conductive pattern 130 can have an opening that exposes at least a portion the first gate electrode 105. A third contact hole of a second connection pattern that will be described below can be located in the opening of the first gate electrode 105, and the first gate electrode 105 can receive the initialization voltage VINT illustrated in FIG. 1 via the third contact hole.

Referring to FIG. 4, an OLED display can include a substrate (not illustrated), an active pattern 100, a gate insulation layer (not illustrated), a first gate electrode 105, a second gate electrode 110, a third gate electrode 115, a forth electrode 120, a first insulating interlayer (not illustrated), a first conductive pattern 150, a second conductive pattern 130, etc. as shown in FIG. 3. The OLED display can further include a second insulating interlayer (not illustrated), a first connection pattern 170, a second connection pattern 230, and a data line 190.

The second insulating interlayer can be formed over the first insulating interlayer to cover the first and second conductive patterns 150 and 130. In example embodiments, the second insulating interlayer sufficiently covers the first and second conductive patterns 150 and has a substantially flat upper surface without a difference of elevation around the first and second conductive patterns 150 and 130. Alternatively, the second insulating interlayer can cover first and second conductive patterns 150 and 130 and can have a substantially uniform thickness along a profile of the first and second conductive patterns 150 and 130. The second insulating interlayer can include an organic material, such as a silicon compound, or an inorganic material, such as a transparent insulating resin. For example, the first insulating interlayer can be formed of one or more of the following materials: a silicon oxide, a silicon nitride, a silicon oxynitride, and etc. These can be used alone or in combination with each other.

The first connection pattern 170, the second connection pattern 230, and the data line 190 can be formed over the second insulating interlayer. The first connection pattern 170, the second connection pattern 230, and the data line 190 can be formed of one or more of the following materials: a metal, an alloy, metal nitride, conductive metal oxide, transparent conductive materials, etc. These can be used alone or in combination with each other.

The first connection pattern 170 can extend in the second direction over the second insulating interlayer and can be electrically connected to the fourteenth region N of the lower electrode 100. For example, the first connection pattern 170 can fill a first contact hole 180 and can be electrically connected to the first conductive pattern 150 and the fourteenth region N via the first contact hole 180. In example embodiments, the first connection pattern 170 can receive the initialization voltage VINT. As a result, the first connection pattern 170 can provide the initialization voltage VINT to the first conductive pattern 150 and the fourteenth region N via the first contact hole 180. Here, the first connection pattern 170 filling the first contact hole 180 can be in contact with a side portion of the first conductive pattern 150 and can be in contact with an upper surface of the fourteenth region N.

The second connection pattern 230 can extend in the second direction over the second insulating interlayer and can be electrically connected to at least a portion the tenth or third regions J and C of the active pattern 100 and at least a portion the first gate electrode 105. For example, the second connection pattern 230 can fill a second contact hole 250 so as to be electrically connected to the at least a portion the tenth or third regions J and C (e.g., a third node N3). In addition, the second connection pattern 230 can fill a third contact hole 270 that is located in the opening of the second conductive pattern 130 so as to be electrically connected to the at least a portion the first gate electrode 105. That is, the second connection pattern 230 can be electrically connected to the tenth or third regions J and C and the first gate electrode 105 via the second contact hole 250 and the third contact hole 270. In example embodiments, the second connection pattern 230 can receive the initialization voltage VINT provided through the fifth transistor TR5 and the sixth transistor TR6. As a result, the second connection pattern 230 can provide the initialization voltage VINT to the first gate electrode 105 via the second contact hole 250 and the third contact hole 270.

When the first conductive pattern 150 is not included in the OLED display, a kickback voltage increases and a voltage fluctuation increases in the third node N3. When the voltage fluctuation increases, a stain (or striped pattern) may be displayed in the OLED display. In example embodiments, the first conductive pattern 150 can be formed to overlap the portion the fourth region D and the fifth region E, and the first conductive pattern 150 can form or define the parasitic capacitor CP together with the portion the fourth and fifth regions D and E with which the first conductive pattern 150 overlaps. Thus, when the scan signal GW is turned-on, the parasitic capacitor CP can reduce the kickback voltage and can decrease the voltage fluctuation in the third node N3. Accordingly, stains can be prevented from being displayed by the OLED display, thereby improving the display quality of the OLED display.

The data line 190 can be electrically connected to the seventh region G of the active pattern 100. For example, the data line 190 can fill a fourth contact hole 210 and can be connected to the seventh region G via the fourth contact hole 210. In example embodiments, the data line 190 receives a data signal DATA as illustrated in FIG. 1. As a result, the data line 190 can provide the data signal DATA to the seventh region G via the fourth contact hole 210.

In example embodiments, the OLED display further includes a third insulating interlayer (not illustrated), a first electrode (not illustrated), a pixel defining layer (not illustrated), an organic light-emitting layer (not illustrated), and a second electrode (not illustrated).

The third insulating interlayer can be formed over the second insulating interlayer to cover the first connection pattern 170, the second connection pattern 230, and the data line 190. In example embodiments, the third insulating interlayer sufficiently covers the first connection pattern 170, the second connection pattern 230, and the data line 190 and has a substantially flat upper surface without a difference of elevation around the first connection pattern 170, the second connection pattern 230, and the data line 190. The third insulating interlayer can include an organic material, such as a silicon compound, or an inorganic material, such as a transparent insulating resin. For example, the third insulating interlayer can be formed of one or more of the following materials: silicon oxide, silicon nitride, silicon oxynitride, etc. These can be used alone or in combination with each other.

The first electrode can be formed over the third insulating interlayer. In particular, the first electrode can be formed over a portion of the third insulating interlayer. The first electrode can be formed of one or more of the following materials: metal, alloy, metal nitride, conductive metal oxide, and transparent conductive material. These can be used alone or in combination with each other.

The first electrode can be electrically connected to the thirteenth region M or the sixteenth region P. For example, the first electrode can be connected to the thirteenth region M or the sixteenth region P via a contact hole (not illustrated). As a result, the first electrode can receive the driving current ID as illustrated in FIG. 1 via the contact hole. In example embodiments, the first electrode is an anode electrode. Alternatively, the first electrode can be a cathode electrode.

The pixel defining layer can be formed over the third insulating interlayer. In particular, the pixel defining layer can be formed over the third insulating interlayer and a portion of the first electrode. The pixel defining layer can form an opening at a portion of the first electrode over the third insulating interlayer, and the organic light-emitting layer can be formed in the opening. The organic light-emitting layer can be formed on the first electrode. In particular, the organic light-emitting layer can be formed on the first electrode exposed via the opening of the pixel defining layer. The organic light-emitting layer can include a light-emitting material that can emit light. The light-emitting material can include organic materials. In example embodiments, the light-emitting material includes organic materials that can emit light corresponding to wavelengths of red light, green light, and/or blue light.

The second electrode can be formed over the pixel defining layer and the organic light-emitting layer. In example embodiments, the second electrode can be formed of a transparent conductive material. For example, the second electrode can be formed of one or more of the following materials: indium tin oxide, indium zinc oxide, zinc oxide, tin oxide, gallium oxide, indium oxide, etc. In example embodiments, the second electrode is a cathode electrode. The first electrode, the organic light-emitting layer, and the second electrode can form the OLED as illustrated in FIG. 1. Alternatively, the second electrode can be an anode electrode. In example embodiments, the second electrode can receive the second power voltage ELVSS illustrated of FIG. 1.

Figure 5:
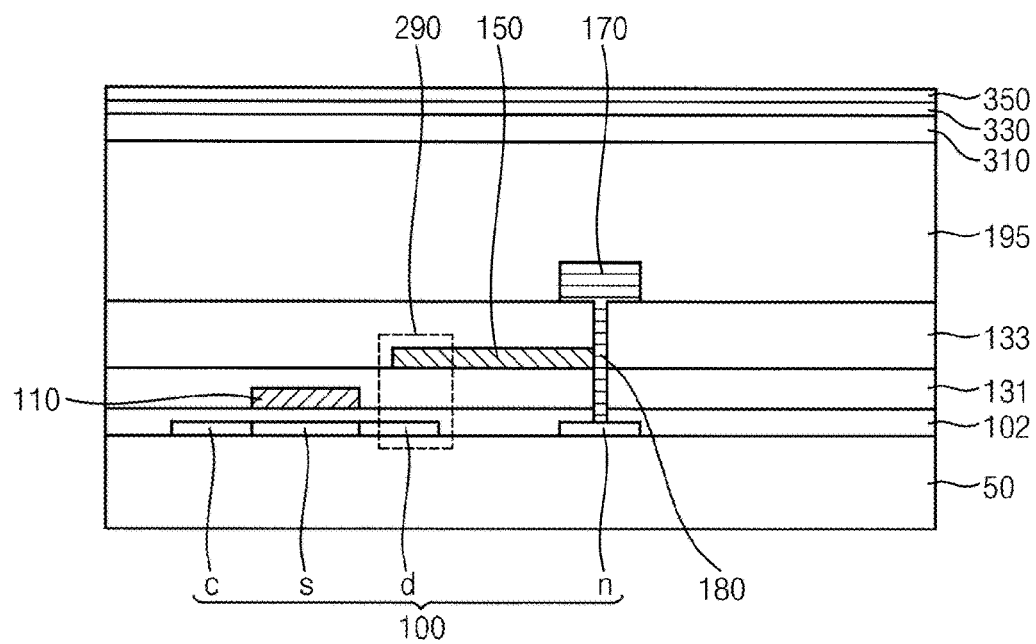
FIG. 5 is a cross-sectional view taken along line I-I' of FIG. 4.
Figure 6:
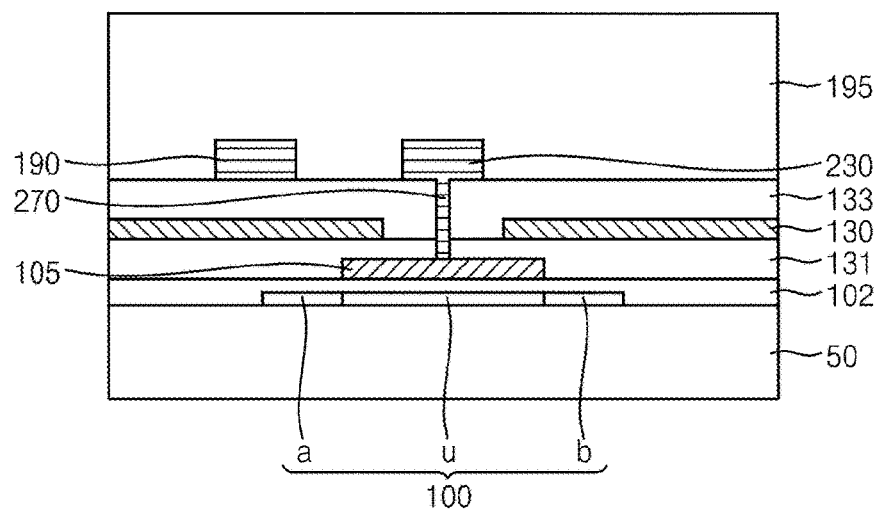
FIG. 6 is a cross-sectional view taken along line II-IF of FIG. 4.

As a result, the OLED display of FIGS. 4 to 6 can include the pixel of FIG. 1 that can improve the display quality of the OLEDs. As described above, according to the location of the parasitic capacitor CP including the first conductive pattern 150, a voltage fluctuation of the gate node (i.e., the third node N3) of the first transistor TR1 can be reduced.

FIG. 5 is a cross-sectional view taken along line I-I' of FIG. 4.

Referring to FIG. 5, the OLED display includes a substrate 50, an active pattern 100, a gate insulation layer 102, a second gate electrode 110, a first insulating interlayer 131, a first conductive pattern 150, a second insulating interlayer 133, a first connection pattern 170, a third insulating interlayer 195, a first electrode 310, a pixel defining layer (not illustrated), an organic light-emitting layer 330, a second electrode 350, etc.

The active pattern 100 is formed over the substrate 50. The substrate 50 can be formed of a transparent electrically insulating material such as glass, transparent plastic, and transparent ceramic. The active pattern 100 can include a third region C, a fourth region D, and a fourteenth region N. The nineteenth region S can be interposed between the third region C and the fourth region D and can be located under the second gate electrode 110 that is described below. In addition, the fourteenth region N can be spaced apart from the fourth region D.

As described above, the gate insulation layer 102 can be formed to cover the active pattern 100. The second gate electrode 110 can be formed over the gate insulation layer 102.

After the second gate electrode 110 is formed, the active pattern 100 can be doped with an impurity. That is, the third region C, the fourth region D, and the fourteenth region N can be doped, and in some embodiments, the nineteenth region S formed below the second gate electrode 110 is not doped with an impurity. As a result, the third region C, the fourth region D, and the fourteenth region N can operate as conductors, and the nineteenth region S formed below the second gate electrode 110 can operate a channel of the second transistor TR2.

The first insulation interlayer 131 can be formed to cover the second gate electrode 110 on the gate insulation layer 102. The first conductive pattern 150 can be formed over the first insulating interlayer 131. The first conductive pattern 150 can overlap at least a portion the fourth region D. The overlapping portion 290 can be parasitic capacitor CP.

The second insulating interlayer 133 can be formed to cover the first conductive pattern 150 on the first insulating interlayer 131. The first connection pattern 170 can be formed over the second insulating interlayer 133. The first connection pattern 170 can fill a first contact hole 180 so as to be in contact with the fourteenth region N via the first contact hole 180. Thus, an initialization voltage VINT can be applied to the first conductive pattern 150 and the fourteenth region N.

The third insulating interlayer 195 can be formed to cover the first connection pattern 170 on the second insulating interlayer 133. The third insulating interlayer 195 can be formed to be relatively thick so as to sufficiently cover the first connection pattern 170. The third insulating interlayer 195 can have a substantially flat upper surface, and a planarization process can be further performed on the third insulating interlayer 195 to provide the third insulating interlayer 195 with the flat upper surface.

The first electrode 310 can be formed over the third insulating interlayer 195. The first electrode 310 can be formed over a portion of the third insulating interlayer 195. For example, the first electrode 310 can be electrically connected to the thirteenth region M or the sixteenth region P via a contact hole (not illustrated). The organic light-emitting layer 330 can be formed over the first electrode 310. Finally, the second electrode 350 can be formed over the organic light-emitting layer 330.

FIG. 6 is a cross-sectional view taken along line II-II of FIG. 4.

Referring to FIG. 6, the OLED display includes a substrate 50, an active pattern 100, a gate insulation layer 102, a first gate electrode 105, a first insulating interlayer 131, a second conductive pattern 130, a second insulating interlayer 133, a data line 190, a second connection pattern 230, a third insulating interlayer 195, etc.

The substrate 50, the active pattern 100, the gate insulation layer 102, the first insulating interlayer 131, the second insulating interlayer 133, and the third insulating interlayer 195 may be substantially the same as or similar to configurations described above with reference to FIG. 5.

The active pattern 100 can include a first region A, a twentieth region U, and the second region B. The twentieth region U can be located under the first gate electrode 105.

As described above, the gate insulation layer 102 can be formed to cover the lower electrode 100. The first gate electrode 105 can be formed over the gate insulation layer 102.

After the first gate electrode 105 is formed, the active pattern 100 can be doped with an impurity. That is, the first region A and the second region B can be doped, and in some embodiments, the twentieth region U formed below the first gate electrode 105 is not doped with an impurity. As a result, the first region A and the second region B can operate as conductors and the twentieth region U formed below the first gate electrode 105 can operate a channel of the first transistor TR1.

The first insulation interlayer 131 can be formed to cover the first gate electrode 105 on the gate insulation layer 102. The second conductive pattern 130 can be formed over the first insulating interlayer 131. The second conductive pattern 130 can have an opening that exposes at least a portion the first gate electrode 105. The second conductive pattern 130 can overlap the first gate electrode 105. The overlapping portion can define a storage capacitor CST.

The second insulating interlayer 133 can be formed to cover the second conductive pattern 130 on the first insulating interlayer 131. The data line 190 and the second connection pattern 230 can be formed over the second insulating interlayer 133. The second connection pattern 230 can fill a third contact hole 270 so as to contact the first gate electrode 105 via the third contact hole 270. Thus, an initialization voltage VINT can be applied to the first gate electrode 105. The third insulating interlayer 195 can be formed to cover the data line 190 and the second connection pattern 230. The third insulating interlayer 195 can be formed to be relatively thick so as to sufficiently cover the data line 190 and the second connection pattern 230.

Figure 7:
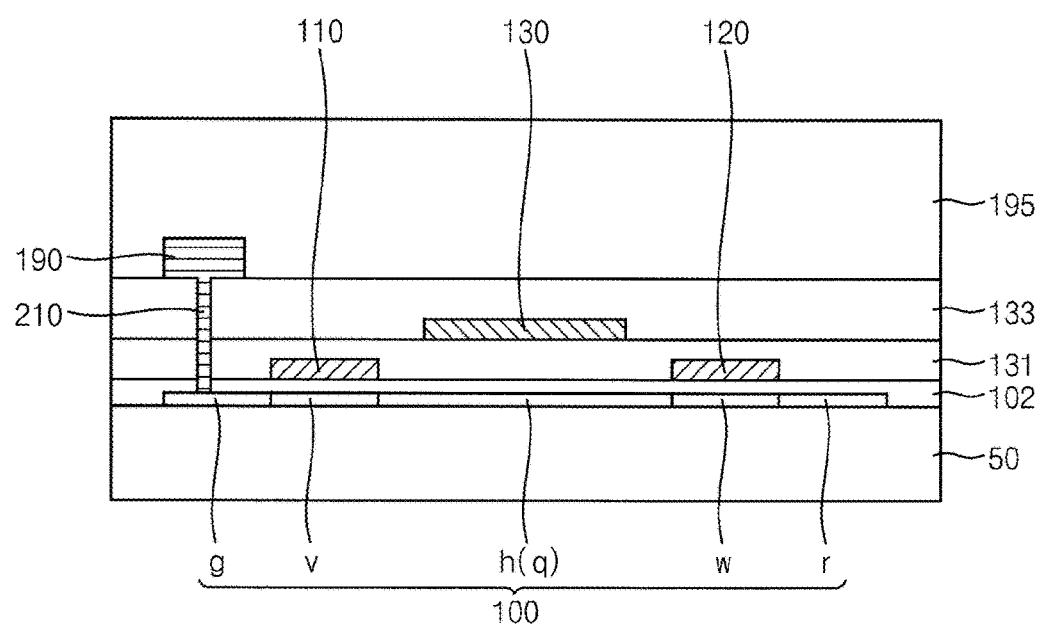
FIG. 7 is a cross-sectional view taken along line of FIG. 4.

FIG. 7 is a cross-sectional view taken along line of FIG. 4.

Referring to FIG. 7, the OLED display includes a substrate 50, an active pattern 100, a gate insulation layer 102, a second gate electrode 110, a fourth gate electrode 120, a first insulating interlayer 131, a second conductive pattern 130, a second insulating interlayer 133, a data line 190, a third insulating interlayer 195, etc.

The substrate 50, the active pattern 100, the gate insulation layer 102, the second gate electrode 110, the first insulating interlayer 131, the second conductive pattern 130, the second insulating interlayer 133, and third insulating interlayer 195 may be substantially the same as or similar to configurations described above with reference to FIGS. 5 and 6.

The active pattern 100 can include a seventh region G, a twenty-first region V, an eighth region H (or a seventeenth region Q), a twenty-second region W, and an eighteenth region R. The twenty-first region V can be located below the second gate electrode 110, and the twenty-second region W can be located below the fourth gate electrode 120.

After the second gate electrode 110 and the fourth gate electrode 120 are formed, the active pattern 100 can be doped with an impurity. That is, the seventh region G, the eighth region H, and the eighteenth region R can be doped, and in some embodiments, the twenty-first region V formed below the second gate electrode 110 and the twenty-second region W formed below the fourth gate electrode 120 are not doped with an impurity. As a result, the seventh region G, the eighth region H, and the eighteenth region R can operate as conductors, and the twenty-first region V formed below the second gate electrode 110 can operate a channel of the fourth transistor TR4. In addition, the twenty-second region W formed below the fourth gate electrode 120 can operate a channel of the ninth transistor TR9.

The first insulation interlayer 131 can be formed to cover the second gate electrode 110 and fourth gate electrode 120 on the gate insulation layer 102. The second conductive pattern 130 can be formed over the first insulating interlayer 131.

The second insulating interlayer 133 can be formed to cover the second conductive pattern 130 on the first insulating interlayer 131. The data line 190 can be formed over the second insulating interlayer 133. The data line 190 can fill a fourth contact hole 210 so as to be in contact with the seventh region G via the fourth contact hole 210. Thus, a data signal DATA can be applied to the seventh region G. The third insulating interlayer 195 can be formed to cover the data line 190. The third insulating interlayer 195 can be formed to be relatively thick so as to sufficiently cover the data line 190.

The described technology can be applied to various display devices including an OLED display. For example, the described technology can be applied to a mobile phone, a smart phone, a smart pad, a laptop computer, a tablet computer, a personal digital assistant (PDA), a portable multimedia player (PMP), a digital camera, a music player (e.g., an MP3 player), a portable game console, a navigation system, a vehicle-display device, a ship-display device, an aircraft-display device, portable communication devices, display devices for display or information transfer, a medical-display device etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive technology. Accordingly, all such modifications are intended to be included within the scope of the invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light-emitting diode (OLED) display, comprising:
    a substrate;
    an active pattern formed over the substrate and including:
        a first region, a second region, a third region, a fourth region, a fifth region, and a sixth region, wherein the second region and the sixth region are: i) electrically connected to each other and ii) formed directly adjacent each other in a first continuous region of the active pattern, and wherein the fourth region and the fifth region are: i) electrically connected to each other and ii) formed directly adjacent each other in a second continuous region of the active pattern;
    a gate insulation layer formed over the active pattern;
    a first gate electrode formed over the gate insulation layer, wherein the first gate electrode defines a first transistor together with the first region and the second region;
    a second gate electrode formed on the same layer as the first gate electrode, wherein the second gate electrode defines: i) a second transistor together with the third region and the fourth region which are arranged in a first direction ii) a third transistor together with the fifth region and the sixth region which are arranged in a second direction, wherein the fifth region and the sixth region are on opposite sides of a gate region of the third transistor, and wherein the second direction is substantially perpendicular to the first direction;
    a first insulating interlayer formed over the first gate electrode, the second gate electrode, and the gate insulation layer;
    a first conductive pattern formed over the first insulating interlayer, wherein the first conductive pattern overlaps at least a portion of the fourth and fifth regions in a thickness direction of the substrate, wherein the first conductive pattern defines a parasitic capacitor together with the portion of the fourth and fifth regions; and
    an OLED configured to receive a driving current from the first transistor,
    wherein the second and third transistors are configured to provide an initialization voltage to the first transistor.

2. The OLED display of claim 1, wherein the second gate electrode includes:
    a second gate extended portion extending in the first direction; and
    a second gate protruding portion protruded from the second gate extended portion in the second direction.

3. The OLED display of claim 2, wherein a first portion of the second gate extended portion is configured to serve as a gate electrode of the third transistor, and wherein a first portion of the second gate protruding portion is configured to serve as a gate electrode of the second transistor.

4. The OLED display of claim 1, wherein the second and third transistor are directly connected in series.

5. The OLED display of claim 3, wherein the active pattern further includes a seventh region and an eighth region, wherein the second gate electrode defines a fourth transistor together with the seventh region and the eighth region, wherein a second portion that opposes the first portion of the second gate extended portion is configured to serve as a gate electrode of the fourth transistor, and wherein the eighth region is electrically connected to the first region.

6. The OLED display of claim 1, further comprising a second conductive pattern formed on the same layer the first conductive pattern, wherein the second conductive pattern overlaps the first gate electrode and the first and second regions of the active pattern, wherein the second conductive pattern defines an opening that exposes at least a portion the first conductive pattern, and wherein the second conductive pattern defines a storage capacitor together with the first gate electrode.

7. The OLED display of claim 6, wherein the second conductive pattern and the first conductive pattern are formed of a same material.

8. The OLED display of claim 1, further comprising a second insulating interlayer formed over the first conductive pattern and the first insulating interlayer.

9. The OLED display of claim 8, further comprising a first connection pattern formed over the second insulating interlayer, wherein the first connection pattern is configured to apply the initialization voltage to the first conductive pattern.

10. The OLED display of claim 9, wherein the first connection pattern fills a first contact hole, and wherein the first connection pattern is electrically connected to the first conductive pattern via the first contact hole.

11. The OLED display of claim 10, wherein the active pattern further includes a ninth region, a tenth region, an eleventh region, a twelfth region, a thirteenth region, a fourteenth region, a fifteenth region, a sixteenth region, a seventeenth region, and an eighteenth region.

12. An organic light-emitting diode (OLED) display, comprising:
a substrate;
an active pattern formed over the substrate and including: a first region, a second region, a third region, a fourth region, a fifth region, a sixth region, a ninth region, a tenth region, an eleventh region, a twelfth region, a thirteenth region, a fourteenth region, a fifteenth region, a sixteenth region, a seventeenth region, and an eighteenth region, wherein the second region and the sixth region are: i) electrically connected to each other and ii) formed in a first continuous region of the active pattern, and wherein the fourth region and the fifth region are: i) electrically connected to each other and ii) formed in a second continuous region of the active pattern;
a gate insulation layer formed over the active pattern;
a first gate electrode formed over the gate insulation layer, wherein the first gate electrode defines a first transistor together with the first region and the second region;
a second gate electrode formed on the same layer as the first gate electrode, wherein the second gate electrode defines: i) a second transistor together with the third region and the fourth region which are arranged in a first direction ii) a third transistor together with the fifth region and the sixth region which are arranged in a second direction, wherein the second direction is substantially perpendicular to the first direction;
a first insulating interlayer formed over the first gate electrode, the second gate electrode, and the gate insulation layer;
a first conductive pattern formed over the first insulating interlayer, wherein the first conductive pattern overlaps at least a portion of the fourth and fifth regions in a thickness direction of the substrate, wherein the first conductive pattern defines a parasitic capacitor together with the portion of the fourth and fifth regions; and
a second insulating interlayer formed over the first conductive pattern and the first insulating interlayer;
a first connection pattern formed over the second insulating interlayer;
a third gate electrode formed over the gate insulation layer, wherein the third gate electrode defines: i) a fifth transistor together with the ninth region and the tenth region, ii) a sixth transistor together with the eleventh region and the twelfth region, and iii) a seventh transistor together with the thirteenth region and the fourteenth region;
a fourth gate electrode formed on the same layer as the third gate electrode, wherein the fourth gate electrode defines: i) an eighth transistor together with the fifteenth region and a sixteenth region and ii) a ninth transistor together with the seventeenth region and the eighteenth region; and
an OLED configured to receive a driving current from the first transistor,
wherein the second and third transistors are configured to provide an initialization voltage to the first transistor.

13. The OLED display of claim 12, wherein the active pattern further includes an eighth region, wherein the ninth region is electrically connected to the eleventh region, wherein the tenth region is electrically connected to the third region, wherein the twelfth region is electrically connected to the fourteenth region, wherein the fifteenth region is electrically connected to the second region and the sixth region, and wherein the seventeenth region is electrically connected to the first region and the eighth region.

14. The OLED display of claim 13, further comprising a third insulating interlayer formed over the first connection pattern and the second insulating interlayer, wherein the OLED includes:
a first electrode formed over the third insulating interlayer, wherein the first electrode is electrically connected to the thirteenth region or the sixteenth region;
an organic light-emitting layer formed over the first electrode; and
a second electrode formed over the organic light-emitting layer.

15. The OLED display of claim 12, wherein the second gate electrode is configured to receive a scan signal, wherein the third gate electrode is configured to receive a data initialization signal, and wherein the fourth gate electrode is configured to receive an emission signal.

16. The OLED display of claim 15, wherein the first conductive pattern is electrically connected to the fourteenth region via a first contact hole, and wherein the twelfth region of the sixth transistor is configured to receive the initialization voltage via the fourteenth region.

17. The OLED display of claim 16, further comprising:
a second connection pattern formed over the second insulating interlayer,
wherein the second connection pattern is electrically connected to a portion of the third or tenth regions and a portion of the first gate electrode,
wherein the second connection pattern fills a second contact hole that is located over the portion of the third or tenth regions and a third contact hole that is located over the portion of the first gate electrode.

18. The OLED display of claim 17, further comprising:
a data line formed over the same layer as the second connection pattern,
wherein the data line extends in the second direction,
wherein the active pattern further includes a seventh region, and
wherein the data line fills a fourth contact hole that is located over the seventh region.

19. The OLED display of claim 12, wherein the fifth and sixth transistors are electrically connected in series and configured to serve as a dual gate transistor.

20. The OLED display of claim 1, wherein the active pattern is formed of an oxide semiconductor.

21. The OLED display of claim 1, wherein a portion of the second gate electrode extends in the second direction between the third region and the fourth region, and wherein the fifth region and the sixth region are directly adjacent to another portion of the second gate electrode that extends in the first direction.

* * * * *